(12) United States Patent
Boehm et al.

(10) Patent No.: US 7,360,306 B2
(45) Date of Patent: Apr. 22, 2008

(54) PROCESS FOR PRODUCING A COVER WITH A GLASS PANE AND ELECTRICAL FUNCTION ELEMENTS

(75) Inventors: Hubert Boehm, Greifenberg (DE); Gerit Erbeck, Niederneuching (DE)

(73) Assignee: Webasto AG, Stockdorf (DE)

(*) Notice: Subject to any disclaimer, the term of this patent is extended or adjusted under 35 U.S.C. 154(b) by 91 days.

(21) Appl. No.: 10/880,096

(22) Filed: Jun. 30, 2004

(65) Prior Publication Data

US 2005/0001456 A1 Jan. 6, 2005

(30) Foreign Application Priority Data

Jul. 1, 2003 (DE) .................. 103 29 643

(51) Int. Cl.
  *H05K 3/30* (2006.01)
(52) U.S. Cl. .................. 29/832; 29/846; 29/897.2; 136/251; 296/215; 296/216.09
(58) Field of Classification Search ............... 29/527.2, 29/611, 830–832, 846–849, 897.2, 592.1; 136/251; 156/106; 296/215, 216.07, 216.09; 349/92; 428/216, 332; 359/265, 275

See application file for complete search history.

(56) References Cited

U.S. PATENT DOCUMENTS

| | | | |
|---|---|---|---|
| 4,465,736 A * | 8/1984 | Nishihara et al. | 428/332 |
| 5,213,626 A | 5/1993 | Paetz | |
| 5,239,406 A * | 8/1993 | Lynam | 296/215 |
| 5,602,457 A * | 2/1997 | Anderson et al. | 136/251 |
| 5,867,238 A * | 2/1999 | Miller et al. | 349/92 |
| 5,995,272 A | 11/1999 | Pätz | |
| 6,034,320 A * | 3/2000 | Malcherczyk et al. | 136/251 |
| 6,391,481 B1 | 5/2002 | Jonas et al. | |
| 6,942,288 B2 * | 9/2005 | Paetz et al. | 296/216.09 |

FOREIGN PATENT DOCUMENTS

| | | |
|---|---|---|
| DE | 43 23 140 A1 | 12/1994 |
| DE | 195 07 413 A1 | 11/1995 |
| DE | 196 30 812 A1 | 2/1998 |
| DE | 100 43 141 A1 | 3/2002 |
| DE | 101 51 156 A1 | 5/2003 |
| EP | 1 234 721 A2 | 8/2002 |

* cited by examiner

*Primary Examiner*—Donghai D. Nguyen
(74) *Attorney, Agent, or Firm*—David S. Safran

(57) ABSTRACT

A process for producing a cover (11) with a glass pane (14) for a motor vehicle roof, in which, first, a combination film (10) with a shatter prevention film and electrical function elements (22, 24, 26, 28, 30) integrated into the combination film is produced, and then, the combination film is securely attached to a side of the pane, e.g., the side facing the vehicle interior. Furthermore the invention relates to a cover for a motor vehicle roof produced in this manner.

20 Claims, 2 Drawing Sheets

PROCESS FOR PRODUCING A COVER WITH A GLASS PANE AND ELECTRICAL FUNCTION ELEMENTS

BACKGROUND OF THE INVENTION

1. Field of the Invention

This invention relates to a process for producing a cover with a glass pane and electrical function elements.

2. Description of Related Art

Covers provided with electrical function elements for an opening in a motor vehicle roof or solid glass covers are known in various embodiments. For example, published European Patent Application EP 1 234 721 A2 discloses an adjustable cover which is provided with flat illumination elements. The illumination elements are, for example, electroluminescent (EL) films. The required layers (electrodes, EL layer, protective films, etc.) are applied in succession. If, in a transparent region of a motor vehicle roof, the intention is to control the transparency of the cover by applying a voltage, electrochrome (EC) elements are used. Examples of these electrochrome coatings are disclosed in German Patent DE 197 23 596 C1 which corresponds to U.S. Pat. No. 5,995,272 and in published German Patent Application DE 196 30 812 A1.

Alternative elements for controlling the transparency of transparent vehicle surfaces are liquid crystal (LCD) elements and SPD (suspended particle device) layers. One example of such a motor vehicle window system can be found in published German Patent Application DE 100 43 141 A1. If, for example, the cover of a sliding roof is intended to be used as a voltage source, solar elements of semiconductor materials are used. Examples are given in published German Patent Application DE 43 23 140 A1 and published French Patent Application FR 2 673 768 A1 and corresponding U.S. Pat. No. 5,213,626. If the intention is to prevent a glass cover for closing an opening in a motor vehicle roof from shattering and clearing the opening in an accident, tear-resistant and scratch-proof shatter prevention films can be cemented onto the bottom of the pane of the glass cover. One example of this can be found in published German Patent Application DE 101 51 156 A1 corresponding to commonly owned, co-pending U.S. patent application Ser. No. 10/485,711.

In these known possibilities for integration of electrical function elements into covers for motor vehicle roofs, the successive build-up of the layer combination during the production of the cover is a disadvantage. Since the layer combination, for example, in a glass cover in the simplest case is composed of the glass, an adhesive layer, the function element, another adhesive layer and then a protective film, the structure is complex, and moreover, entails the risk of dirt inclusions or lamination faults. This results in high production costs. In addition, combinations of various function elements can only be produced with difficulty in this way. In many cases, for example, in EC coatings, a spherically arched pane must be coated using a vacuum process; this means higher costs for smaller numbers. Known EL films, due to the brittleness of the ITO layers used for the electrodes can only be processed in large radii.

SUMMARY OF THE INVENTION

A primary object of the present invention is to devise a production process for a motor vehicle roof cover with a glass pane in which the cover can be provided with electrical function elements as easily and reliably as possible. Furthermore, such a cover as will be created by means of the process of the invention.

This object is achieved as in accordance with the invention by a process in which first a combination film having a shatter prevention film and electrical function elements integrated therein is produced, and then the combination film is securely attached to a side of the glass pane which, in use, faces a vehicle interior space, and by a cover formed of a glass pane to which such a combination film has been securely attached.

In the approach in of the invention, it is advantageous that, because the electrical function elements are already integrated in a combination film before application to the cover pane, the actual production of the cover is greatly simplified, since only one film need be applied instead of several separate layers, and the risk of dirt inclusions and/or lamination faults in the application of the electrical function elements to the pane can be distinctly reduced. This greatly reduces production costs. Furthermore, combinations of different function elements on the cover can also be more easily implemented. By integration of the electrical function elements in the combination film, the difficulty of exact positioning of otherwise separate films in the application to the cover pane is eliminated. Moreover, floating in the film sandwich during the lamination process can be prevented. Thus, much more complex design versions overall can be implemented.

It is also advantageous that, because the shatter prevention film itself already forms a part of the function elements or acts as a carrier of them, additional films can be saved, by which a cover with reduced thickness and thus reduced installation space requirement can be achieved.

The concept of "electrical function element" is intended here to include all electrical components including electrically active coatings and layers.

The invention is explained in detail below by way of example using the accompanying figures of the drawings.

DETAILED DESCRIPTION OF THE INVENTION

Figure 1:
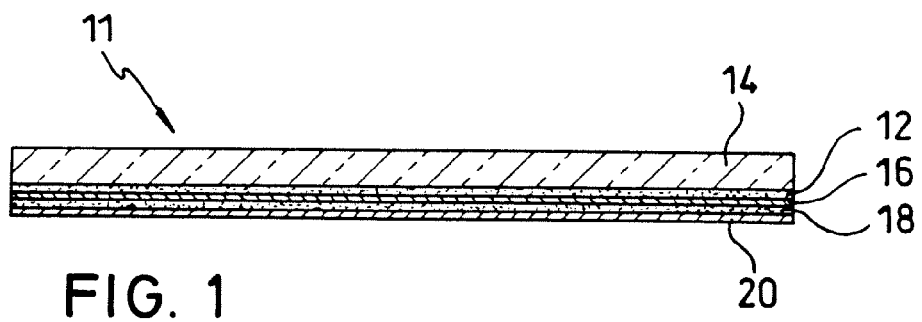
FIG. 1 is a sectional view of a motor vehicle roof cover with electrical function elements according to the prior art.

FIG. 1 shows a glass cover 11 of a motor vehicle roof into which electrical function elements have been integrated in the conventional manner. To do this, a carrier film 16 provided with electrical function elements is laminated onto the bottom of a glass pane 14 by means of a hot-melt adhesive film 12. A shatter prevention film 20 is then laminated onto the carrier film 16 with the function elements by means of another hot-melt adhesive film 18 and is designed to protect the film 16 with the function elements and the pane 14 from environmental effects and scratching, and in case of a fracture of the pane 14, it is designed to prevent the shards from falling into the vehicle interior. This structure, although it contains only a few layers, is already relatively complex to process, and moreover, entails the risk of dirt and air inclusions upon successive application of different layers. When the different layers are laminated, it needs to be ensured especially that optically unobjectionable viewing through the glass cover 14 is preserved.

Figure 2:
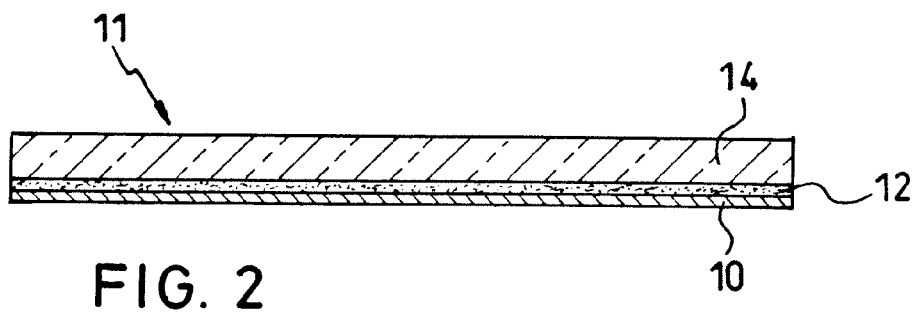
FIG. 2 shows a section through a motor vehicle roof cover as in accordance with the invention, in which the electrical function elements are contained in a combination film.

Conversely, FIG. 2 shows a section through a glass cover 11 in accordance with the invention. In this case, the producer of the plastic film integrates the electrical function elements in during the production of the film to form a combination film 10 which is laminated onto the bottom of the glass pane 14 by means of a hot-melt adhesive film 12. A laminator or an autoclave can be used for thermal lamination.

Alternatively, the combination film 10 can also be cemented to the bottom of the glass pane 14 with a cement, for example, a polyurethane (PU) or acrylic resin cement.

To produce the combination film 10, the electrical function elements can be applied, for example, with a coating process, such as vacuum coating or preferably silk-screen printing or by cementing to a first film. Electrical function elements can be, for example, electroluminescent elements, electrochrome elements, SPD (suspended particle device) elements, liquid crystal elements, touch pads, light diffusing elements, thin film solar cells, transparent solar cells or organic light emitting diodes (OLED).

A second film can be laminated onto the first for enclosure of the function elements in order to obtain the combination film 10, or the first film itself acts as a part or carrier of the function elements which are to be implemented. To prevent shattering, one of the films, preferably the film most closely facing the vehicle interior, is a shatter prevention film of polycarbonate or polyethyleneterephthalate, for example. Hot-melt adhesive films can be, for example, those of PVB or TPU according to the material of the shatter prevention film.

To fix the shatter prevention film on the edge of the cover, it is provided with perforations 32 into which the peripheral foam of the cover can fit.

If the function elements are LCD layers, there can be an IR-reflective coating to prolong the service life. For SPD elements there can be an UV reflective coating for the same purpose.

The electrode material for the contacts of the function elements is preferably a conductive polymer, similarly to those described in published German Patent Application DE 198 41 803 A1 or DE 195 07 413 A1. In this way, small bending radii can also be accomplished.

Electrical insulation of the contacts relative to the hot-melt adhesive film 12 can be achieved by a suitably insulating coating in the combination film 10.

Figure 3:
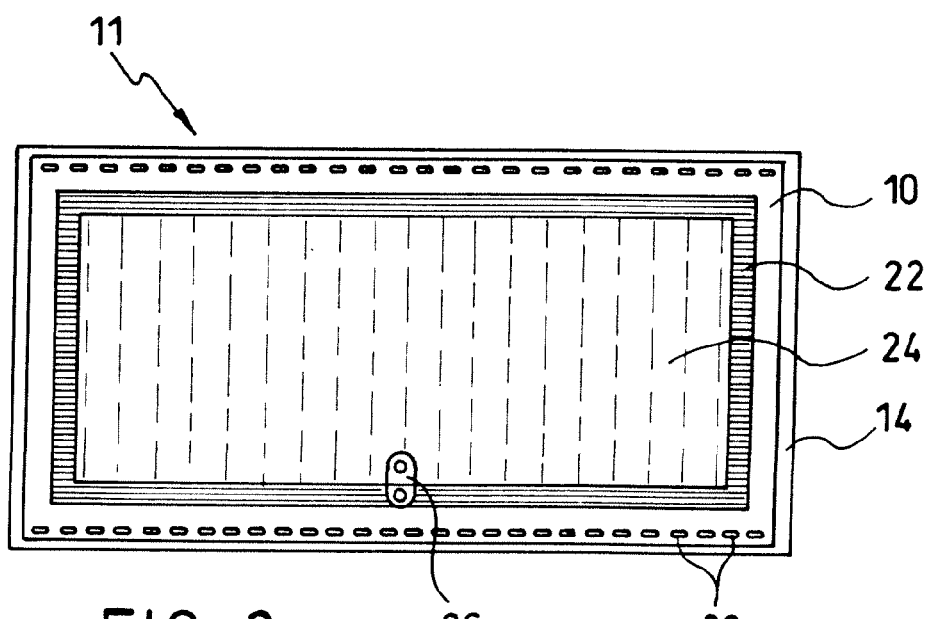
FIG. 3 is a top plan view of the glass cover of the invention for closing the opening in a motor vehicle roof with integrated electrical function elements.

One example of the integration of different electrical function elements into a combination film 10 for producing a glass cover 11 for an opening in a motor vehicle roof is shown in FIG. 3. Here, a glass pane 14 is coated with a combination film 10, in the middle of which there is an LCD, SPD or EC area 24 which is surrounded by a strip-shaped electroluminescent element 22. The individual function elements are connected via integrated touch pads 26.

Figure 4:
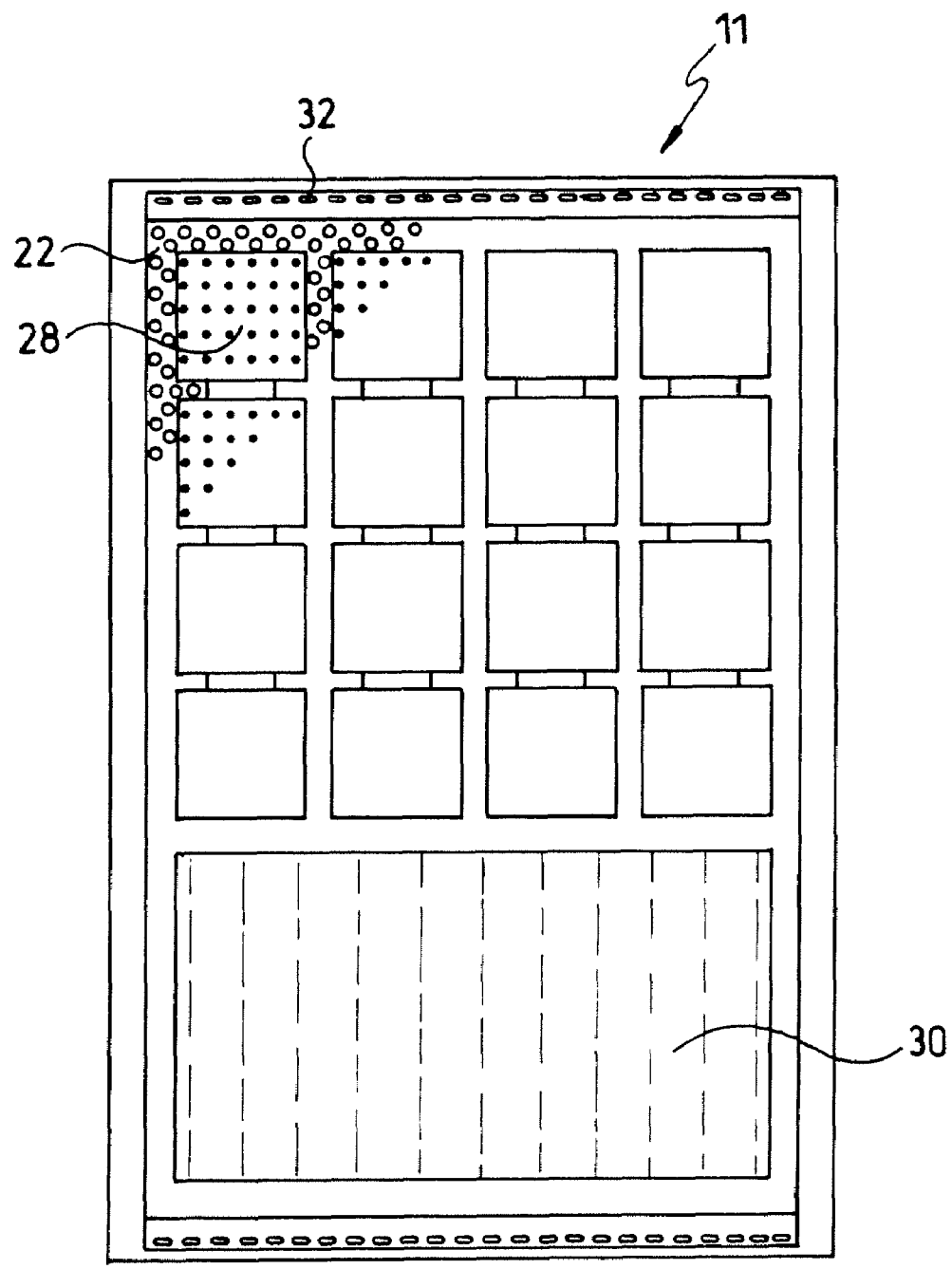
FIG. 4 is a view like FIG. 3, but showing a modified embodiment in accordance with the invention.

FIG. 4 shows another motor vehicle surface part in accordance with the invention, in which electroluminescent elements 22 are integrated together with transparent solar cells 28 and an EC area 30. The EL areas can be made here as hole grids with transparent holes in order to achieve an appearance similar to transparent solar cells 28. A viewing area which can be darkened is additionally integrated into the glass cover made in this way by the EC area 30.

In the case of transparent solar cells, to simplify production, a pure plastic film module can be produced by using a roller laminator and it is then laminated onto the glass cover. However, this application is not limited only to entirely or partially transparent/translucent glass covers, but can also be accomplished in a nontransparent cover with conventional, crystalline or polycrystalline solar cells.

What is claimed is:

1. Process for producing a cover with a single glass pane for a motor vehicle roof, comprising,
   first producing a combination film having a shatter prevention film with perforations in an edge area thereof and electrical function elements integrated therein, and
   then securely attaching the combination film to a side of the single glass pane which, in use, faces a vehicle interior space;
   fixing the shatter prevention film to the cover by an edge foam of the cover being foamed into said perforations;
   wherein the combination film is provided at various points with different types of electrical function elements having different functions; and
   wherein the different types of electrical function elements comprise an electroluminescent element and at least one of solar cells, an liquid crystal display (LCD), an suspended particle device (SPD) and an electrochrome (EC) area.

2. Process as claimed in claim 1, wherein the electrical function elements are applied to a first film by coating.

3. Process as claimed in claim 2, wherein said coating is performed by a vacuum coating or silk-screen printing process.

4. Process as claimed in claim 1, wherein the electrical function elements are cemented to a first film.

5. Process as claimed in claim 4, wherein the combination film is transparent at least in portions.

6. Process as claimed in claim 1, wherein the electrical function elements are provided with contact electrodes formed of a conductive polymer material.

7. Process as claimed in claim 6, wherein an insulation coating is applied to the electrical function elements after the contact electrodes are formed.

8. Process as claimed in claim 1, wherein the function elements are applied to a first film, then the electrical function elements are provided with electrical contacts, and then a second film is applied to the function elements.

9. Process as claimed in claim 8, wherein the first film is the shatter prevention film.

10. Process as claimed in claim 9, wherein the shatter prevention film is a polycarbonate or polyethyleneterephthalate film.

11. Process as claimed in claim 1, wherein the combination film with the electrical function elements is laminated onto the bottom of the pane using a hot-melt adhesive film or a cement.

12. Process as claimed in claim 11, wherein a laminator or autoclave is used for lamination.

13. Process as claimed in claim 11, wherein a polyurethane (PU) or acrylic resin cement is used.

14. Process as claimed in claim 11, wherein a polyvinylbutyral (PVB) or a thermoplastic polyurethane (TPU) hot-melt adhesive film is used.

15. Process as claimed in claim 1, wherein the electrical function elements additionally comprise at least one element selected from the group consisting of touch pads, light diffusing elements, and organic light emitting diodes.

16. Process as claimed in claim 1, wherein the cover is transparent.

17. Process as claimed in claim in claim 1, wherein the cover is mounted securely in a roof opening.

18. Process as claimed in claim in claim 1, wherein the cover is adjustable in order to alternately close the roof opening and at least partially clear it.

19. Process as claimed in claim 1, wherein at least one of an infrared (IR) and ultraviolet (UV) reflecting layer is incorporating into the combination film.

20. Process as claimed in claim 1, wherein touch-sensitive switches are integrated into the combination film in order to switch the electrical function elements.

* * * * *